US012787646B2

(12) United States Patent
Kämpfe et al.

(10) Patent No.: US 12,787,646 B2
(45) Date of Patent: Nov. 3, 2026

(54) MOVABLE PIEZO ELEMENT AND METHOD FOR PRODUCING A MOVABLE PIEZO ELEMENT

(71) Applicant: Fraunhofer-Gesellschaft zur Förderung der Angewandten Forschung E.V., Munich (DE)

(72) Inventors: Thomas Kämpfe, Dresden (DE); Patrick Polakowski, Dresden (DE); Konrad Seidel, Dresden (DE)

(73) Assignee: Fraunhofer-Gesellschaft zur Förderung der Angewandten Forschung E.V., Munich (DE)

( * ) Notice: Subject to any disclaimer, the term of this patent is extended or adjusted under 35 U.S.C. 154(b) by 1149 days.

(21) Appl. No.: 17/757,365

(22) PCT Filed: Dec. 18, 2020

(86) PCT No.: PCT/EP2020/086998
§ 371 (c)(1),
(2) Date: Jun. 15, 2022

(87) PCT Pub. No.: WO2021/123147
PCT Pub. Date: Jun. 24, 2021

(65) Prior Publication Data

US 2023/0013976 A1 Jan. 19, 2023

(30) Foreign Application Priority Data

Dec. 19, 2019 (DE) ..................... 10 2019 220 126.1

(51) Int. Cl.
*H01L 41/047* (2006.01)
*H10N 30/00* (2023.01)
(Continued)

(52) U.S. Cl.
CPC ......... *H10N 30/2042* (2023.02); *H10N 30/06* (2023.02); *H10N 30/076* (2023.02); *H10N 30/706* (2024.05); *H10N 30/877* (2023.02)

(58) Field of Classification Search
CPC . H10N 30/2042; H10N 30/877; H10N 30/706
See application file for complete search history.

(56) References Cited

U.S. PATENT DOCUMENTS 5,536,963 A 7/1996 Polla
2012/0153778 A1 6/2012 Jun et al.
(Continued)

FOREIGN PATENT DOCUMENTS

CN 107511318 A 12/2017
EP 2423729 A1 2/2012
(Continued)

OTHER PUBLICATIONS

English Translation of CN 107511318 (Year: 2017).*
(Continued)

*Primary Examiner* — Bryan P Gordon
(74) *Attorney, Agent, or Firm* — Marshall & Melhorn, LLC

(57) ABSTRACT

A movable piezo element and to a method for producing the element are provided. The movable piezo element may have a structured substrate, in which an intermediate layer is arranged between a first substrate layer and a second substrate layer. The element may also have a first electrode layer. The element may also have a second electrode layer arranged on the ferroelectric, piezoelectric, or flexoelectric layer. The second substrate layer may be structured such that at least one bar of the second substrate layer is formed. The bar may be clamped on one side and may be physically spaced from the first substrate layer. A surface of the bar facing away from the first substrate layer, and/or a lateral
(Continued)

surface of the bar, may be at least partly covered by another layer.

9 Claims, 8 Drawing Sheets

(51) Int. Cl.

| | |
|---|---|
| ***H10N 30/06*** | (2023.01) |
| ***H10N 30/076*** | (2023.01) |
| ***H10N 30/20*** | (2023.01) |
| ***H10N 30/87*** | (2023.01) |

(56) References Cited

U.S. PATENT DOCUMENTS

| | | | | |
|---|---|---|---|---|
| 2013/0154439 | A1 | 6/2013 | Lee et al. | |
| 2014/0267508 | A1* | 9/2014 | Ohashi | B41J 2/1629 310/330 |
| 2017/0155038 | A1* | 6/2017 | Caraveo | H10N 30/2042 |
| 2017/0352796 | A1* | 12/2017 | Naono | H10N 30/20 |
| 2018/0120938 | A1* | 5/2018 | Frescas | G06F 3/016 |
| 2021/0020825 | A1* | 1/2021 | Moheimani | H10N 30/306 |
| 2021/0067123 | A1* | 3/2021 | Shealy | H03H 3/02 |

FOREIGN PATENT DOCUMENTS

| | | | |
|---|---|---|---|
| JP | 2004079991 | A | 3/2004 |
| JP | 2015195721 | A | 5/2015 |
| WO | 2017093823 | A1 | 6/2017 |

OTHER PUBLICATIONS

German Patent and Trademark Office, German Office Action in Application No. 10 2019 220 126.1, dated Jun. 18, 2020, 13 pages, München, Germany.

European Patent Office, International Search Report and Written Opinion in application No. PCT/EP2020/086998, dated Mar. 31, 2021, 11 pages, Rijswijk, Netherlands.

* cited by examiner

MOVABLE PIEZO ELEMENT AND METHOD FOR PRODUCING A MOVABLE PIEZO ELEMENT

FIELD

The present invention relates to a movable piezo element and to a method of producing a movable piezo element.

BACKGROUND

In electromechanical systems, systems primarily oscillating out of plane are built up that can be operated electrostatically or piezoelectrically. While pie-zoelectrically oscillating systems have good integration capability, they are cost-intensive. A power consumption and capacitive load are very high due to the high permittivity of the frequently used material lead zirconate titanate (PZT) that is moreover toxic and is therefore also not RHoS compliant (Restriction of Hazardous Substances, EU directive 2011/65/EU). In this respect, comparatively high voltages of more than 20 V are used and an in-plane oscillation has not yet been able to be implemented. Furthermore, ultrathin piezoelectric systems by means of the required high crystallization temperatures and the material properties of ultrathin piezoelectric layers are frequently not compatible with nano-electromechanical implementation for extremely highly sensitive travel.

Electrostatically oscillating systems are comb drives as a rule that can likewise typically not be integrated as out-of-plane oscillators and can thus also not compensate external oscillations. In addition, relatively high electrical voltages are in turn required to ensure a large excursion range.

SUMMARY

It is therefore the underlying object of the present invention to propose a movable piezoelectric element and a method of producing same that avoids said disadvantages that therefore enable the simple production of a reliably operating piezoelectric element that is usable in a wide range of applications.

This object is achieved in accordance with the invention by a piezoelectric element in accordance with the claims and by a method in accordance with the claims. Advantageous embodiments and further developments are described in the dependent claims.

A movable piezo element, that is a movable or moving piezoelectric element, preferably a piezo actuator, has a substrate in which an intermediate layer is arranged between a first substrate layer and a second substrate layer. A first electrode layer of an electrically conductive, non-ferroelectric material is applied to the second substrate layer. A ferroelectric, piezoelectric, and/or flexoelectric layer is/are arranged on the first electrode layer and a second electrode layer is arranged thereon that is formed from an electrically conductive, non-ferroelectric material. The second substrate layer is structured such that at least one bar of the second layer mounted on one side is formed that is spatially spaced apart from the first substrate layer. A surface of the bar remote from the first substrate layer and/or a side surface of the bar is at least partially covered by a layer stack of the first electrode layer, the ferroelectric, piezoelectric and/or flexoelectric layer and the second electrode layer.

A targeted control of the oscillation behavior of the bar can take place by the ferroelectric, piezoelectric, and/or flexoelectric layer and the selected covering of the bar with this layer. The oscillation direction can be directly specified by selection of the sides to be covered, with a side surface typically being intended to designate every surface angled with respect to a surface facing or remote from the substrate. The ferroelectric, piezoelectric, and/or flexoelectric layer can additionally be simply and efficiently integrated in existing processes. Provision can be made that the layer stack applied to the side surface and the layer stack applied to the surface remote from the first substrate layer are formed continuously as a single layer stack, i.e. are applied with material continuity. The side surface disposed opposite the covered side surface is typically not covered by the layer stack, i.e. is completely exposed. Alternatively or additionally, the side surface can be completely or entirely covered by the layer stack, while the upper side is preferably only covered up to a maximum of a half by the layer stack.

The first electrode layer and the second electrode layer can here be formed from a material that is the same or identical, but different materials can also be used for these layers. The first electrode layer and the second electrode layer are typically formed from titanium nitride (TiN), tantalum nitride (TaN), ruthenium (Ru), ruthenium oxide (RuO), aluminum, copper, molybdenum, vanadium, chromium, iron, nickel, palladium, cadmium, platinum, cobalt, gold, tin, zinc, indium, or alloys therefrom. In this respect, atomic layer deposition (ALD) and/or physical vapor deposition (PVD) can be used.

The substrate can be formed as a so-called “silicon-on-insulator” wafer (S01 wafer), i.e. the first substrate layer and the second substrate layer are separated from one another by an electrically insulating layer or by a sacrificial layer as an intermediate layer. The electrically insulating layer is thus arranged between the two substrate layers and is in direct contact, that is in proximate touching contact, with each of the layers. Every material whose electric conductivity is less than $10^{-8}$ S/m should be considered as electrically insulating here. The intermediate layer can, however, also be formed from a dielectric material. Heavily doped silicon that has a sufficiently high electric conductivity and can simultaneously have a good structure can be used as the substrate.

Provision can be made that the second substrate layer has a smaller layer thickness than the first substrate layer to ensure the mechanical stability as desired.

The ferroelectric, piezoelectric, and/or flexoelectric layer has a layer thickness of a maximum of 50 nm. At these thicknesses, a change of the polarization state of the ferroelectric that, as the material, forms the ferroelectric, piezoelectric, and/or flexoelectric layer is already achieved at small electrical voltages below 5 V and preferably below 3 V. A required control voltage is thus considerably smaller than with known low voltage solutions and a use for low power applications is possible.

Provision can be made that the first electrode layer, the ferroelectric, piezoelectric, and/or flexoelectric layer and/or the second substrate layer has/have a thickness variation at the side surface of below 10 percent or a maximum of 5 nm to obtain layers that are arranged as aligned as possible above one another.

The bar can be mounted along its longitudinal axis, that is its axis having the greatest extent, at at least one end, typically a front-face end, that is can here form a fixed bearing in a connection having material continuity with the further second substrate layer. The bar is preferably mounted at both ends, typically the front-face ends. Both a system freely oscillating at one end and a centrally oscillating system, that is a system movable centrally in translation, can thus be implemented. Whether the bar oscillates in the layer plane or outside the layer plane depends on the covering of the respective sides by the layer stack. At least one side of the oscillating structure is at least partially covered by the described layer stack, but at least two sides are preferably at least partially covered, particularly preferably three sides. A covering of all the sides is not provided.

The bar can be meandering or spiral or helical to generate a spatially distributed oscillation.

The ferroelectric, piezoelectric, and/or flexoelectric layer can comprise hafnium oxide ($HfO_2$) or zirconium oxide ($ZrO_2$) or doped hafnium oxide ($HfO_2$), or zirconium oxide ($ZrO_2$) as the ferroelectric, piezoelectric and/or flexoelectric material, with the doped hafnium oxide preferably being doped with silicon, aluminum, germanium, gallium, iron, cobalt, chromium, magnesium, calcium, strontium, barium, titanium, zirconium, yttrium, nitrogen, carbon, lanthanum, gadolinium, and/or an element of the rare earths, that is scandium, lanthanum, cerium, praseodymium, neodymium, promethium, samarium, europium, yttrium, gadolinium, terbium, dysprosium, holmium, erbium, thulium, ytterbium, lutetium. Different electric properties can thus be set as desired. Said elements and materials are suitable for a compliant formation of layers.

Provision can also be made that the ferroelectric, piezoelectric, and/or flexoelectric layer has at least one ultralaminate of a layer of hafnium oxide or zirconium oxide and one layer of a different oxide. Provision can therefore be made in order to increase breakdown strength that the ferroelectric, piezoelectric and/or flexoelectric intermediate layer is formed as multi-layer and has at least one layer of an oxide layer having a thickness of less than 3 nm and a hafnium oxide layer or zirconium oxide layer having a thickness between 2 nm and 20 nm. This configuration also increases the switching voltage, for example by a factor of 5, in addition to the breakdown voltage. An alternating series control of the ferroelectric capacitors can additionally be carried out for high voltage applications. It is thus possible due to the CMOS compatibility of the hafnium oxide or of the zirconium oxide and of said dopants to produce further electronics on the same substrate, that is an on-chip production. The described element can be produced as a single miniaturized SMD component (surface mounted device) so that even very small construction shapes such as the 01005 format can be operated. The oxide layer can be formed as an aluminum oxide layer ($Al_2O_3$), a silicon oxide layer ($SiO_2$), and/or a zirconium oxide layer ($ZrO_2$).

At least one applied layer, but preferably each of the applied layers, that is the first electrode layer, the ferroelectric, piezoelectric, and/or flexoelectric intermediate layer and the second electrode layer are formed as a compliant layer that covers the layer disposed thereunder with which they are in proximate, that is direct, contact without cutouts or holes.

The described movable piezo element can be used as a MEMS (microelectromechanical system) switch, as a MEMS filter, as a MEMS phase shifter, as a cantilever for atomic force microscopy, as a microfluid switch, as a microfluid valve, as a micromirror, as a micropositioner, as a loudspeaker, as a microphone, as a seismograph, as a microspectrometer, as a micromechanical latching mechanism, as a micromechanical step motor, as a Fabry-Perot interferometer, or as a flagelliform drive for a micromechanical application.

In a method of producing a movable piezo element, a substrate in which an intermediate layer is arranged between a first substrate layer and a second substrate layer is structured such that the second substrate layer is removed in at least one region such that at least one elevated portion of the second substrate layer is formed in the region. A first electrode layer of an electrically conductive, non-ferroelectric material is applied to the second substrate layer of the substrate, a ferroelectric, piezoelectric, and/or flexoelectric layer is applied to the first electrode layer, and a second electrode layer of an electrically conductive, non-ferroelectric material is applied to the ferroelectric, pie-zoelectric, and/or flexoelectric layer. At least one bar of the second substrate layer that is mounted on one side is subsequently generated in that the intermediate layer between the bar of the second substrate layer and of the first substrate layer is removed.

The intermediate layer can be formed from an electrically insulating oxide that preferably has a thickness between 100 nm and 10 μm. Methods such as atomic layer deposition (ALD), physical vapor deposition (PVD), or chemical vapor deposition (CVD) can be used for the application.

Before the removal of the intermediate layer, a filler layer partially covering the second electrode layer can be applied that is subsequently structured such that as a mask, preferably as a hard mask, it does not cover at least the side surface of the bar. The layer stack is subsequently as a rule also removed at this side surface of the bar. The layer stack can be arranged on only one side surface, on only one surface, or on one of the side surfaces, and one of the surfaces. The respective surface can be partially or completely covered by the layer stack. Surfaces of the bar that are disposed opposite one another are typically covered by the layer stack by different proportions.

The filler layer is typically removed by means of a wet chemical etching process and the at least one side surface of the bar is here preferably also exposed.

The described device, that is the described piezo element, is typically carried out by the described method, i.e. the described method is configured to produce the described device.

Provision can be made as the last method step that the first electrode layer and the second electrode layer are electrically contacted by an electrical voltage source to be able to control the movement in a targeted manner. The electrical voltage source can also be connected to a control/regulation unit for this purpose.

DESCRIPTION OF THE FIGURES

Embodiments of the invention are shown in the drawings and will be explained in the following with reference to FIGS. 1 to 16.

There are shown.

DETAILED DESCRIPTION

Figure 1:
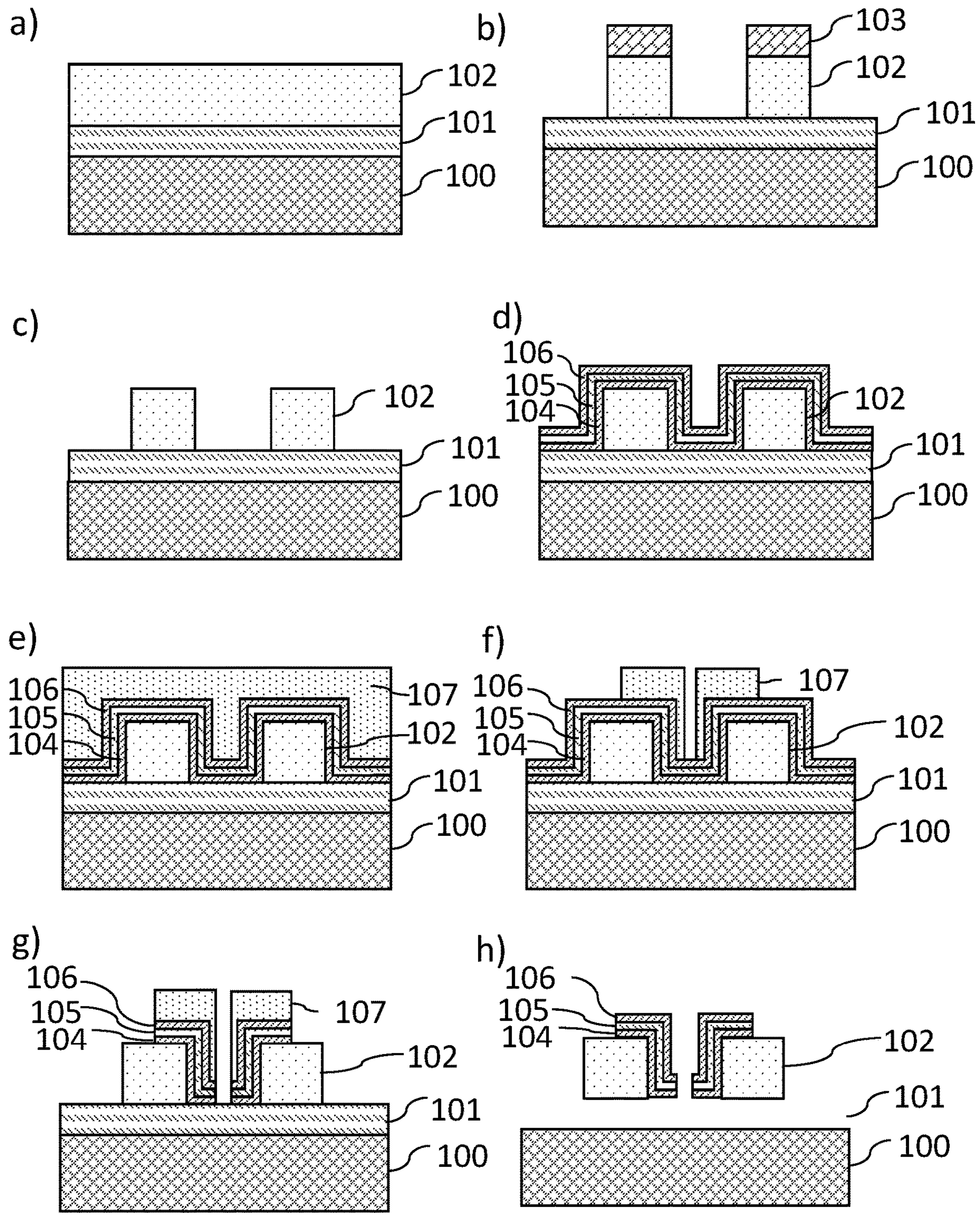
FIG. 1 a schematic representation of a method of producing a highly integrated piezoelectric element in a side view.

FIG. 1 shows a method of producing a piezoelectric element in a schematic view. In Figure la, a substrate is shown in a cross-sectional view in which an intermediate layer or sacrificial layer 101 is arranged between a first layer 100 as a first substrate layer and a second layer 102 as a second substrate layer. The substrate is a so-called "silicon-on insulator" wafer in the embodiment shown, i.e. the first layer 100 and the second layer 102 consist of intrinsic or heavily doped silicon, while the intermediate layer 101 in this embodiment is produced from a typical sacrificial layer material known from the production of microelectromechanical systems, typically silicon oxide. Metals such as aluminum, copper, molybdenum, vanadium, chromium, iron, nickel, palladium, cadmium, platinum, cobalt, gold, tin, zinc, indium, or alloys therefrom, conductive oxides such as doped strontium titanate, lanthanum strontium manganite, and also further elastic materials, preferably electrically conductive materials, such as silicon nitride, carbon nanotube films, or polymers having a high glass transition temperature can furthermore in particular be considered for the second substrate layer 102.

The second layer 102 as a later, oscillating element can be applied with a layer thickness of 50 nm to 10 μm, preferably 100 nm to 2 μm. The intermediate layer 101 as a sacrificial layer or an insulating layer can have a layer thickness between 100 nm and 10 μm, preferably 200 nm to 3 μm.

The structure shown in FIG. 1*b*) in which the second layer 102 has at least one elevated portion, typically a columnar or wall-shaped elevated portion, is obtained by applying a hard mask or resist layer 103 and a subsequent structuring (for example by wet chemical etching, ion etching, or reactive ion etching) of the second layer 102 as the elastic layer.

The hard mask or the resist layer or the resist film 103 is removed by an etching, preferably a dry etching, as shown in FIG. 1*c*). A first electrode layer 104 is applied in a compliant manner as a back electrode on the second layer 102 of the substrate. The first electrode layer 104 is applied by atomic layer deposition from an electrically conductive material such as titanium nitride to obtain a compliant deposition. Alternatively, other metals can, however, be used as the electrode material such as aluminum, copper, molybdenum, vanadium, chromium, iron, nickel, palladium, cadmium, platinum, cobalt, gold, tin, zinc, indium, or alloys therefrom, and also further elastic materials, preferably electrically conductive materials, such as silicon nitride, doped or undoped alloys of silicone and germanium such as B:SiGe, carbon nanotube films, or polymers having a high glass transition temperature. In this case, the second substrate layer 102 and the first electrode layer 104 can be present in a common layer.

A ferroelectric, piezoelectric, or flexoelectric layer 105 of hafnium oxide, zirconium oxide, or alloys therefrom is deposited as a ferroelectric material on the first electrode layer 104, for which purpose atomic layer deposition has likewise been used. The ferroelectric layer 105 is in turn formed as a compliant layer. In further embodiments, an alternating atomic layer deposition of hafnium oxide and a respective dopant or an alternating atomic layer deposition of hafnium oxide and a respective dopant and alternatingly a further oxide, for example $Al_2O_3$ can take place. In this case, nitrogen, yttrium, carbon, strontium, scandium, silicon, aluminum, gadolinium, iron, germanium, gallium, lanthanum, and also rare earths can be considered as the dopant.

The second electrode layer 106 is in turn applied as a compliant layer on the ferroelectric, piezoelectric, or flexoelectric layer 105 by means of atomic layer deposition and the structure shown in FIG. 1*d*) is thus achieved. Instead of atomic layer deposition, physical vapor deposition can also be used. Alternatively to this, a further layer can also be applied that acts as a hard mask. In this respect, the materials already named for the first electrode layer 104 can be considered as the materials.

All the layers are in direct contact with the respective adjacent layers and cover these layers completely. The structure formed in this manner is, as shown in FIG. 1*e*), filled with a filler layer 107 completely covering the second electrode layer 106 so that it forms a planar surface. The filler layer 107 is here typically formed from $SiO_2$ and is applied by means of chemical vapor deposition. Other oxides can also be considered as the materials here.

The filler layer 107 is subsequently structured such that a respective side of the oscillator is liberated from the filler layer 107 (FIG. 1*f*). The metal ferroelectric metal layer stack formed from the first electrode layer 104, the ferroelectric, piezoelectric, or flexoelectric layer 105, and the second electrode layer 106 is subsequently etched, preferably by means of a wet chemical etching, which results in the configuration shown in FIG. 1*g*). A central connection of the layer stack between the remaining bars of the second semiconductor layer is subsequently separated in the embodiment shown and the remaining intermediate layer 106 beneath the bar is removed so that they can be present mounted on one side or at two sides, but can oscillate (FIG. 1*h*).

Figure 11:
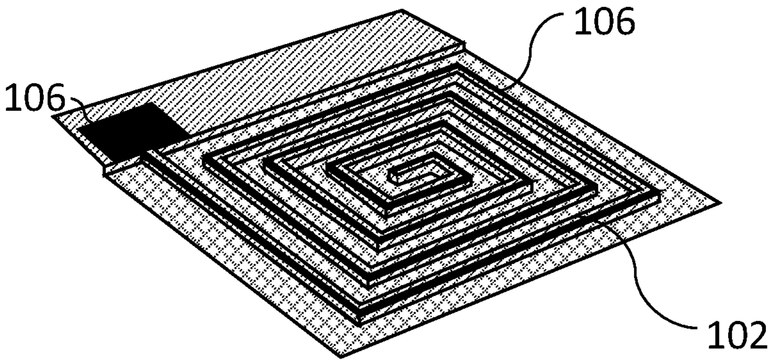
FIG. 11 a perspective view of a spiral system having a piezo element.

In this respect, side surfaces facing one another can be completely covered by the layer stack, while the upper sides are only covered by the layer stack by half. An electrical contacting of the first electrode layer 104 and of the second electrode layer 106 can be provided by a voltage source 110 as the last step. The configuration obtained by means of the method shown in FIG. 1 is shown in FIG. 11.

The described method can be easily integrated in the CMOS process flow of a high k metal gate process flow in that so-to-say a ferroelectric, piezoelectric, or flexoelectric capacitor is applied to a membrane (namely the substrate) and the piezoelectric properties are thus implemented. In this respect, the ferroelectric, piezoelectric, or flexoelectric phase of the materials is used. The piezoelectric expansion or shrinking in the plane of the membrane while applying an electrical voltage to the first electrode layer and the second electrode layer by an electrical voltage source results in a bending of the membrane. Unlike in electrostatic systems, this direction of movement is implemented in both mechanical strain directions.

The ferroelectric, piezoelectric, or flexoelectric layer 105 as a thin film is, as already mentioned, CMOS compatible and is often implemented as a gate dielectric in common CMOS processes. The described piezoelectric elements can therefore be produced in a CMOS process line, which allows lower production costs and a higher throughput than with conventional methods. The small thickness of the capacitor thereby formed enables a high scalability for very greatly miniaturized systems. Since the piezoelectric element is lead-free, RHoS compliance is also present. A capacitor having an insulating layer is formed in the described method whose piezoelectric properties result in distortion. A vertical integration is also made possible by the compliant deposition of the ferroelectric, piezoelectric, or flexoelectric in three-dimensionally structured substrates. Significant tensions of the film and thus a bending of the bar is generated even at small electrical voltages below 5 V by use of a thin film ferroelectric, piezoelectric, or flexoelectric. The required control voltage is thus considerably below currently available low voltage solutions or other oscillators based on electrostatic approaches. In the embodiment shown, a thin film ferroelectric, piezoelectric, or flexoelectric having a thickness below 50 nm is used. Changes of the polarization state thus already result at small electrical voltages and the required control voltage is considerably smaller than in already known low voltage solutions. This is in particular sensible at low power solutions.

It is possible to use ultralaminates to increase a breakdown strength. They are oxide layer of, for example, $Al_2O_3$, $SiO_2$, or $ZrO_2$ having a layer thickness of a maximum of 3 nm. They are introduced alternatingly to the doped or undoped hafnium oxide or zirconium oxide or alloys therefrom with single layer thicknesses of 3 nm to 20 nm. In addition to a breakdown voltage, a switching voltage is thus also increased and raised by a factor of at least 5. An alternating series control of the ferroelectric, piezoelectric, or flexoelectric capacitors can additionally be carried out for high voltage applications.

Hafnium oxide doped with silicon, aluminum, germanium, magnesium, calcium, strontium, barium, titanium, zirconium, nitrogen, carbon, silicon, gallium, iron, cobalt, nickel, cadmium, scandium, yttrium, lanthanum, vanadium, and elements of the rare earths or undoped hafnium oxide as well as further compliant ferroelectrics that can be deposited can be considered as materials. In comparison with other ferroelectrics, these materials have a much smaller permittivity; considerably reduced loss currents are therefore caused by the capacitive load. It is thus possible due to the CMOS compliance of the hafnium oxide ($HfO_2$) or of the zirconium oxide ($ZrO_2$) and of said dopants to produce further electronics on the same substrate, that is an on-chip production, as a so-called system-on-chip (SoC). The described element can, however, also be produced as a single miniaturized SMD component (surface mounted device) so that even very small construction shapes such as the 01005 format can be operated. The oxide layer can be formed as an aluminum oxide layer ($Al_2O_3$), a silicon oxide layer ($SiO_2$), and/or a zirconium oxide layer ($ZrO_2$).

The described piezo element is suitable for different applications, for example, uses in sound, ultrasound, microfluids, micropumps, or microoptics. A use in radio frequency technology can equally also take place. In these application fields, considerable miniaturizations can be achieved in comparison with known techniques. A high degree of design freedom that thus allows a good scaling of the resonances can be achieved for the sound and ultrasound applications by the integration capability in the CMOS and MEMS process flow. A vibration compensation that is necessary in a rough environment to ensure the functional capability is furthermore possible by a configuration of out-of plane and in-plane oscillators on a single chip.

Figure 2:
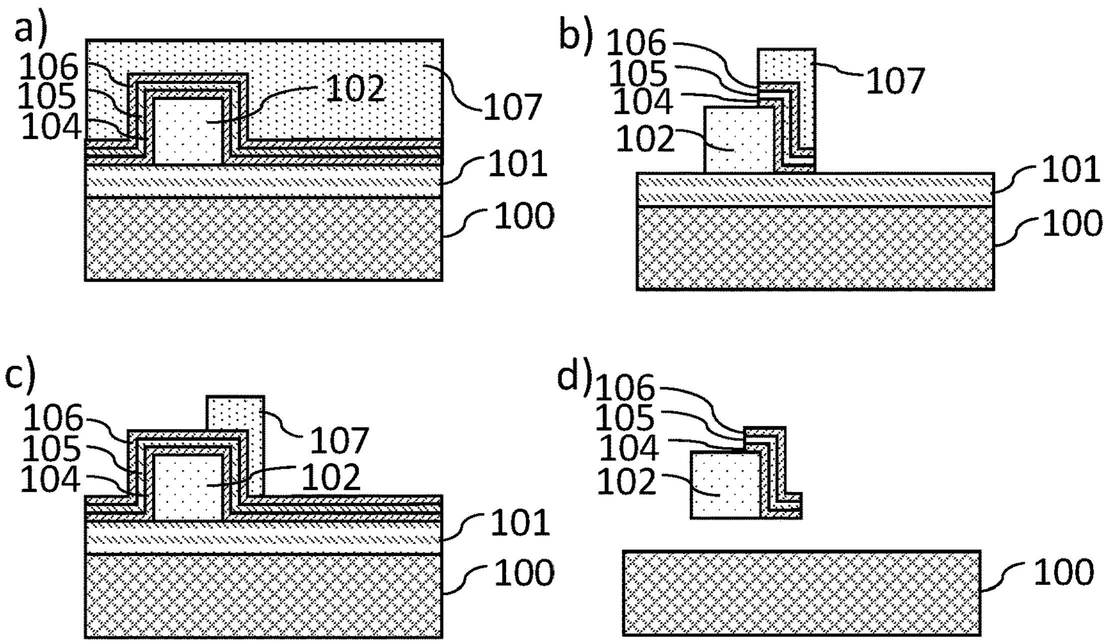
FIG. 2 a schematic representation of a method of producing a single piezoelectric element in a view corresponding to FIG. 1.

In FIG. 2, an analogous method with a single cantilever is shown in a view corresponding to FIG. 1. Recurring elements are provided with identical reference numerals in this Figure and also in the following Figures. Since one of the side surfaces is completely covered and the surface remote from the first substrate layer 100 is covered by at least half by the layer stack at the bar itself, a monomorphic in-plane oscillator can be implemented. The layer stack applied to the side surface and the layer stack applied to the surface remote from the first substrate layer 100 are here formed continuously as a single layer stack, i.e. are applied with material continuity. The side surface disposed opposite the covered side surface is not covered by the layer stack, i.e. is completely exposed.

Figure 3:
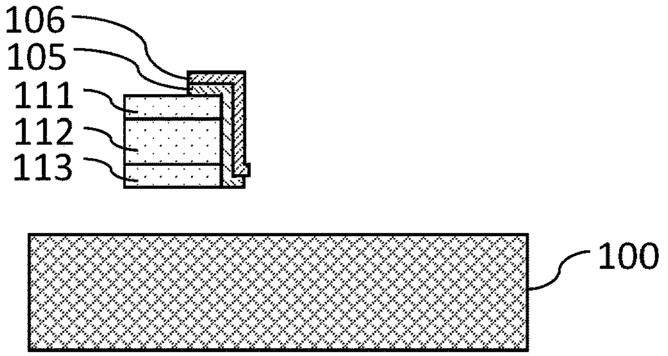
FIG. 3 a cross-section of a piezoelectric element in a view corresponding to FIG. 1.

In FIG. 3, a heterostructure of the first layer 102 is shown in a view corresponding to FIG. 1. The same materials of the layer 102 can here be considered as the materials for the three layers 111, 112, 113 in this example. It can furthermore consist of more than the shown three layers. Since one of the side surfaces is completely covered and the surface remote from the first substrate layer 2 is covered by at least half by the layer stack at the bar itself, a monomorphic in-plane oscillator can be implemented.

Figure 4:
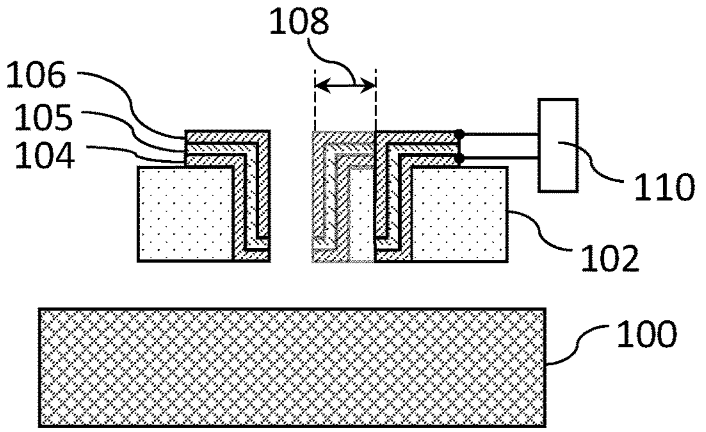
FIG. 4 a schematic representation of the excursion of a piezo element oscillating in plane in a view corresponding to FIG. 1.

The mechanism of the movement of the layer movable in the plane is shown schematically in FIG. 4 in a side view corresponding to FIG. 1 with a possible contacting of the oscillator. The first electrode layer 104 and the second electrode layer 106 are connected to the electrical voltage source 110. On application of a voltage, the oscillator or cantilever moves by the distance 108 in the plane. There is a proportional relationship here between the excursion and the applied voltage in the static case. This thus also enables negative excursions or a good controllability of the excursion.

Figure 5:
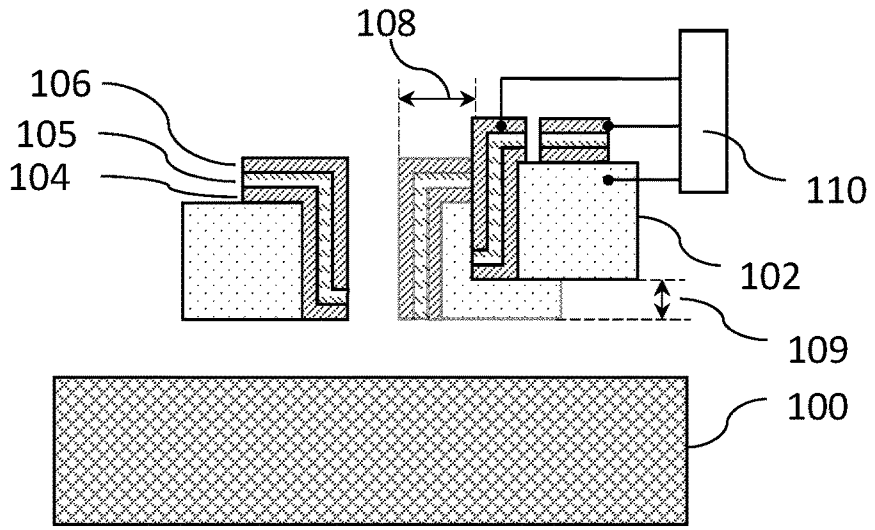
FIG. 5 a schematic representation of the excursion of a piezo element oscillating both in plane and out of plane in a view corresponding to FIG. 1.

The mechanism is shown schematically in FIG. 5 of both in-plane and outplane movability, that is the three-dimensional movability, of the layer 102 or of the cantilever formed therefrom in a side view corresponding to the preceding Figures. In this respect, the layer stack of the first electrode layer 104 and the second electrode layer 106 and the ferroelectric, piezoelectric, and/or flexoelectric layer 105 is structured correspondingly so that a separate contacting of the now separated electrode layers 106 and 104 is made possible by means of the voltage source 110. On application of an electrical voltage, the oscillator moves in the plane or in the cantilever by the distance 108 in-plane and by the distance 109 out-plane. There is a proportional relationship here between the excursion and the applied voltage.

Figure 6:
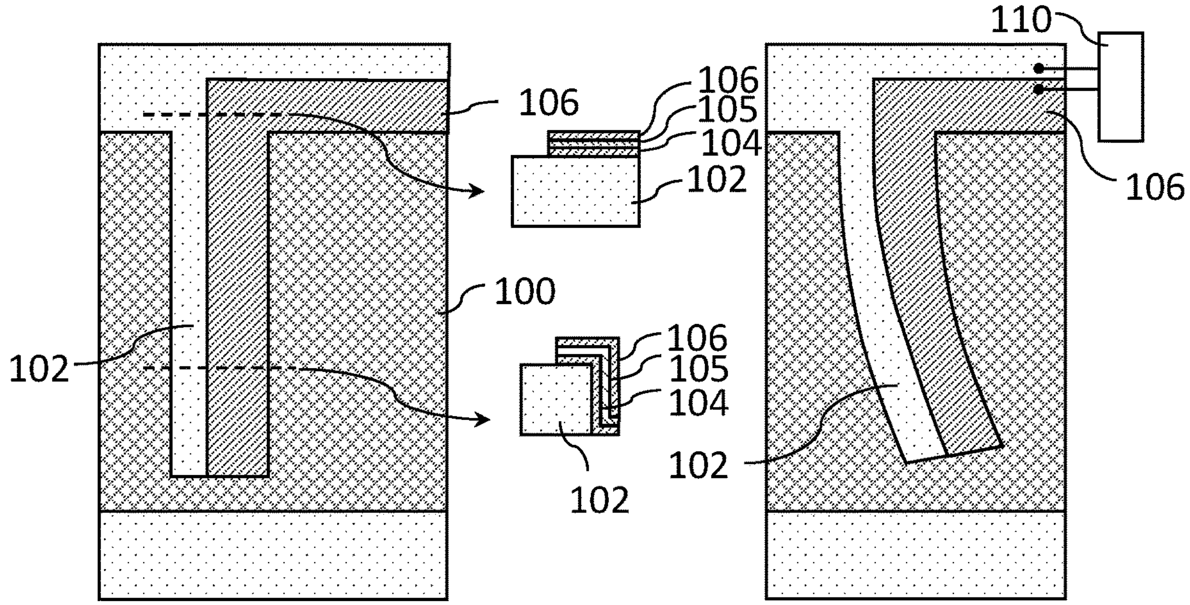
FIG. 6 a schematic representation of the excursion of a piezo element oscillating in plane in a plan view and a side view.

FIG. 6 shows, analogously to FIG. 4, the excursion of the bar mounted on one side in a corresponding side view and in a plan view.

Figure 7:
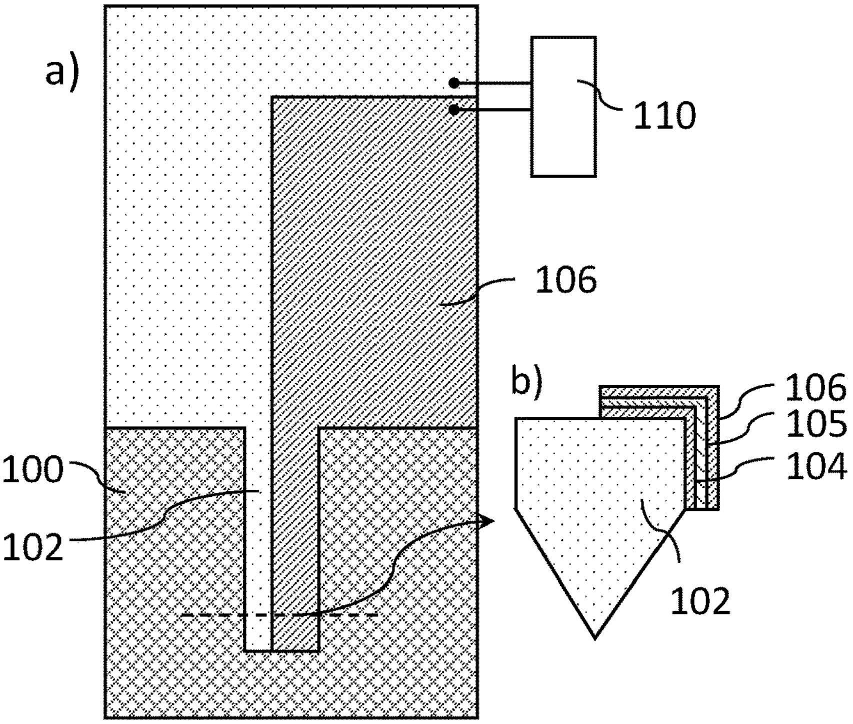
FIG. 7 a piezoelectric element for the deflection of an atomic force microscope tip in a view corresponding to FIG. 6.

FIG. 7 shows a cantilever for atomic force microscopy (AFM) in a plan view and in a side view with which an in-plane movement can likewise be achieved.

This is sensible, for example, for optically assisted AFM methods. The signal of the damping is used to regulate the AFM peak here. The alternating voltage is applied between the second substrate layer 102 as the semiconductor layer and the upper, second electrode layer 106. FIG. 7*b*) shows the corresponding peak in a side view.

Figure 8:
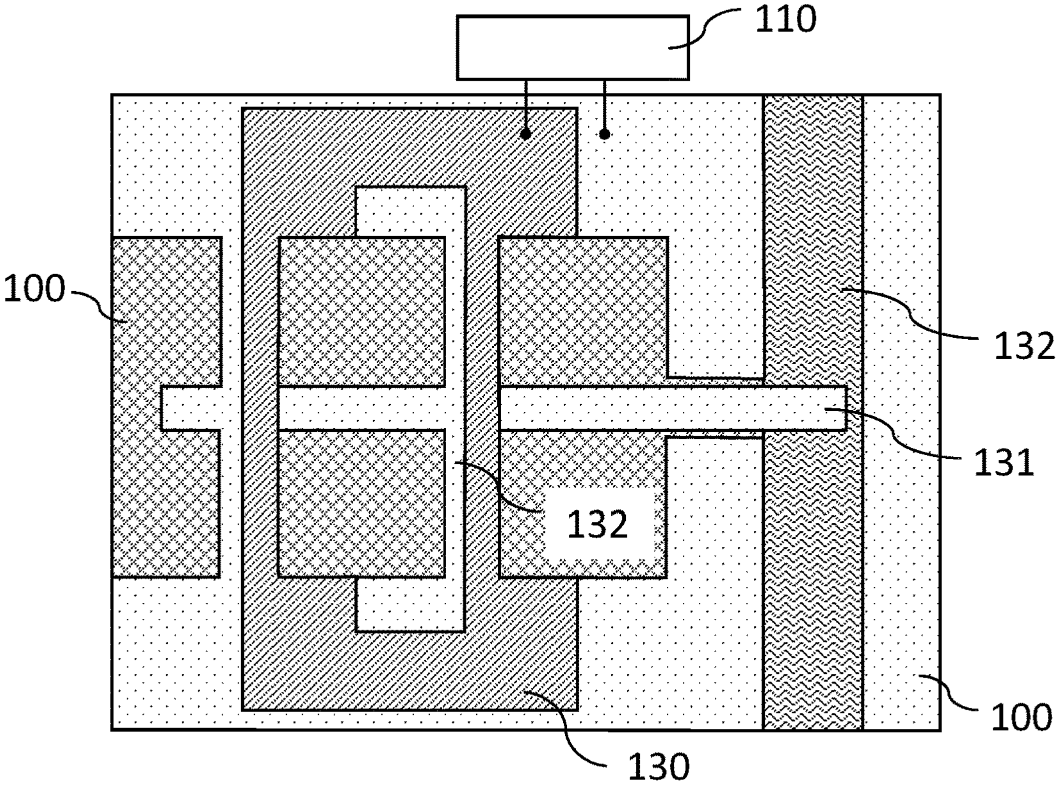
FIG. 8 a plan view of a piezoelectric element that is used in a lateral movement as a switch or as a microfluidic sluice.

A microfluid spigot or a microfluid switch is shown in a plan view in FIG. 8. A plurality of movable bars can be combined here, as shown; for example, to implement a valve for the throughflow of a microfluid channel 132. A coupling to the outer electrical voltage source 110 results in a change of the flow path.

Figure 9:
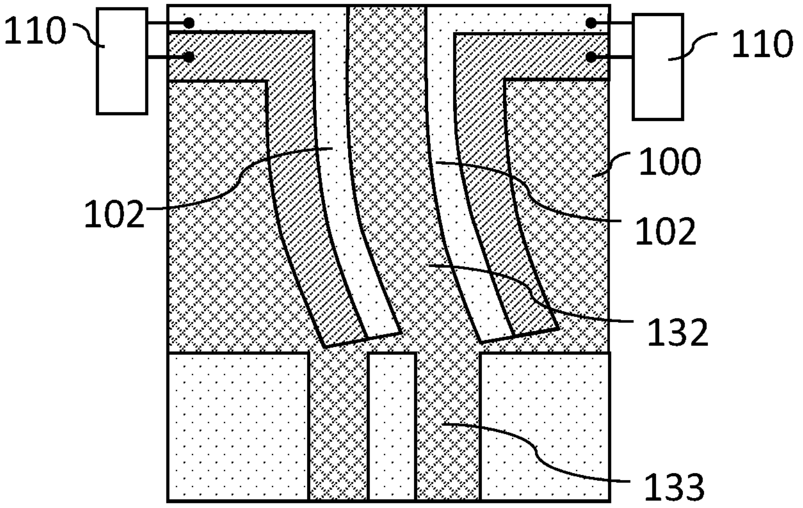
FIG. 9 a view corresponding to FIG. 8 of a use of a piezoelectric element in a lateral movement as a switch or as a microfluid valve.

A microfluid switcher or a microfluid switch 133 is shown in a plan view in FIG. 9. The bar movable in-plane can be arranged in a row and can, for example, be contacted by a common top electrode 130 to move a bar 131 linearly. The electrode 130 can equally be present in a further structured manner. The bar 131 can be introduced into a microfluid channel 132, for example. It here results in a control of the throughflow of the microfluid channel 132. The lateral position of the bar can thus be varied, and the throughflow can thus be con-trolled, by means of an external voltage of the voltage source 110, which can equally serve as a switch for the throughflow.

Figure 10:
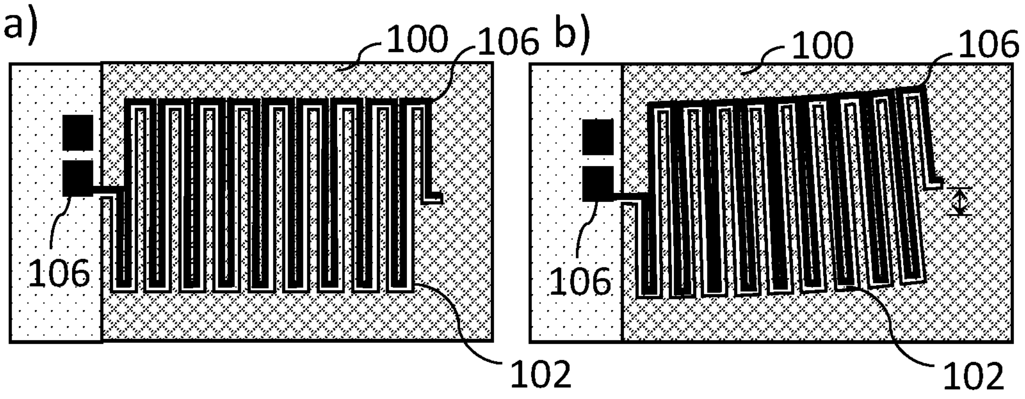
FIG. 10 a plan view of an oscillating, meandering piezo element.

The oscillating bar can also be meandering, as shown in a plan view in the unloaded state and in the loaded state in FIG. 10. This enables a considerably increased excursion, as shown in the simulation shown schematically in FIG. 10.

A spiral shape or helical shape of the oscillating part is shown schematically in a perspective view in FIG. 11. This shape is particularly suitable for gyroscopes or (Cardan) mirror holders.

In further embodiments, the second electrode layer can also be applied compliantly as a mirror stack, for example by a heterostructure of titanium oxide and aluminum oxide (e.g. 67 nm $Al_2O_3$ and 49 nm $TiO_2$ produce a mirror for a wavelength range from 420 nm to 500 nm). In particular laser light can be deflected by this and an integration into a Fabry-Perot system is possible.

Figure 12:
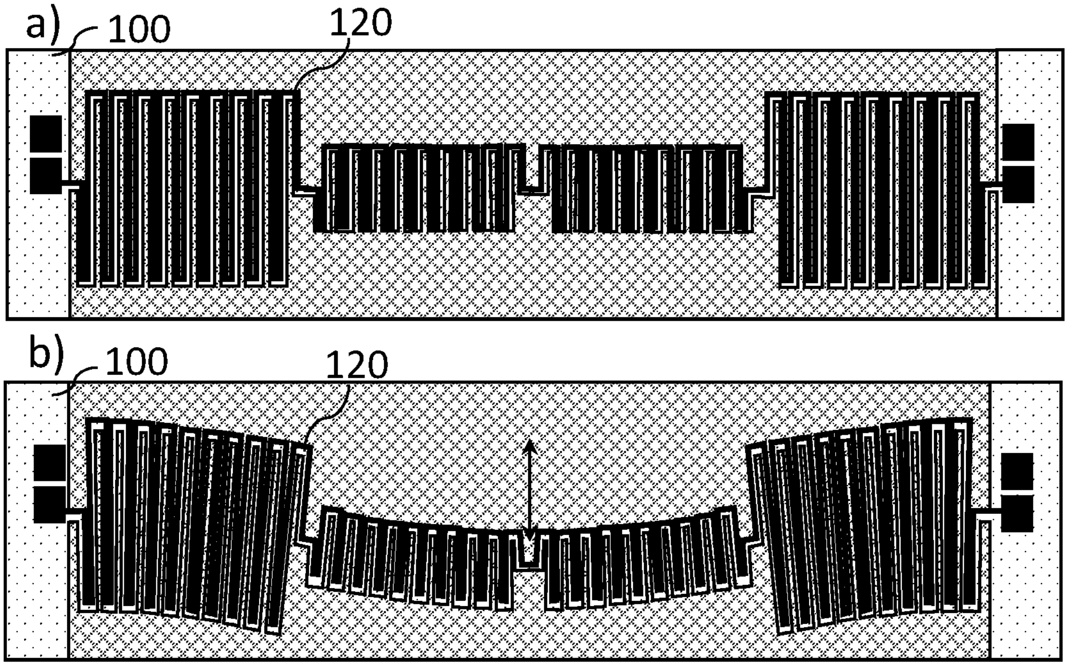
FIG. 12 a simulation of an oscillating, meandering membrane in a plan view.

FIG. 12 shows a meandering structure in a plan view. A particularly elastic material is used as the material for the membrane element. As shown in the non-deflected state in FIG. 12*a*), a plurality of meandering structures as inplane oscillators can also be connected to an inner spring. FIG. 12*b*) shows the deflected state.

Analogously to a miniaturized loudspeaker, the piezoelectric membrane can also be used to detect sound waves, that is it can be used as a microphone. The sound waves induce a movement of the membrane and a measurable electrical voltage and a measurable electric current are thus generated. Such a loudspeaker can also be used as a seismograph.

Figure 13:
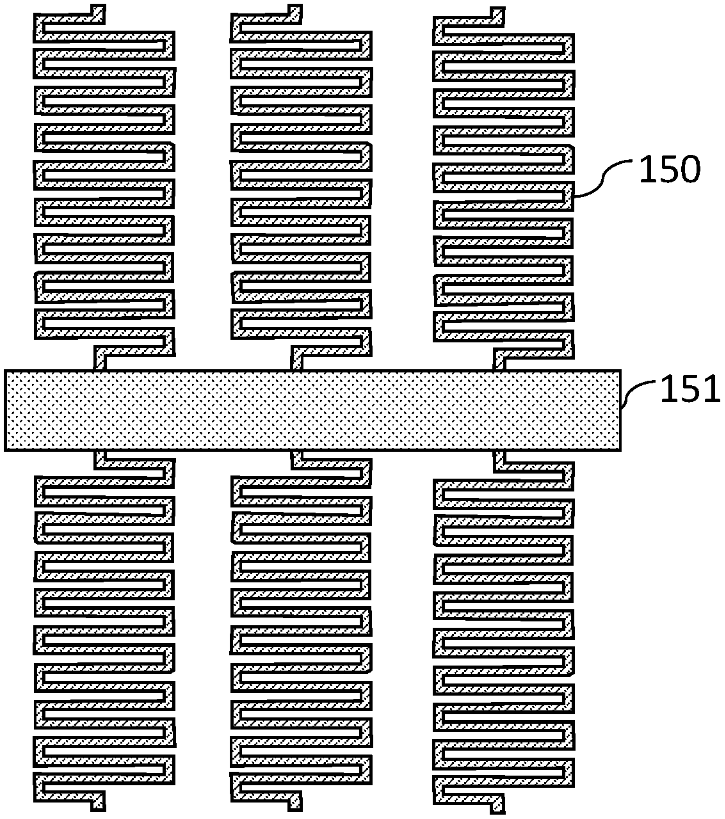
FIG. 13 a schematic representation of a miniaturized drive in a plan view.

A miniaturized drive based on the already proposed cantilever, preferably in the meandered form 150, is shown in a schematic plane view in FIG. 13. It is possible to drive small objects, so-called nanobots, in a fluid by a battery or other electrical energy source. A body also has to be exposed for this purpose. An adaptation of the RC times for applying the voltage by small conductivity should takes place so that the CMOS circuit 151 drawn at the center of FIG. 13 regulates the voltage at the individual drivetrains or flagellums. Small antenna elements may also be contained that enable an external control.

A microspectrometer has a mirror element that can also be applied on the side and on the upper side by means of atomic layer deposition. These systems can then be integrated in a so-called “silicon photonics device” to rotate the beam between different optical paths, for example. A use as a spectrometer is likewise possible, with the meandering form being able to be used as an optical grid here.

With a plurality of cantilevers, a concave mirror shape can also be implemented with which a focus can be generated or also deactivated by means of an electric control of the individual cantilevers.

Figure 14:
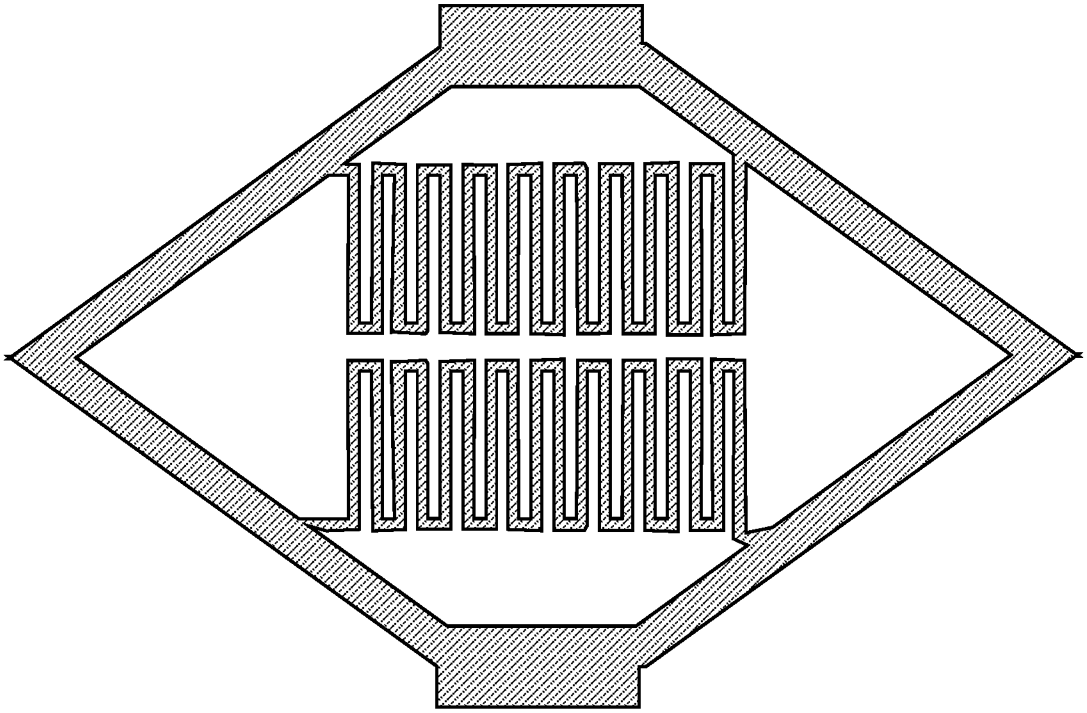
FIG. 14 a plan view of a micropositioner.

FIG. 14 shows a micropositioner in a plan view in which a bar or an object associated therewith can be positioned by means of a plurality of cantilevers. It is moreover also possible to implement a miniaturized loudspeaker by means of the discussed membrane structure.

Figure 15:
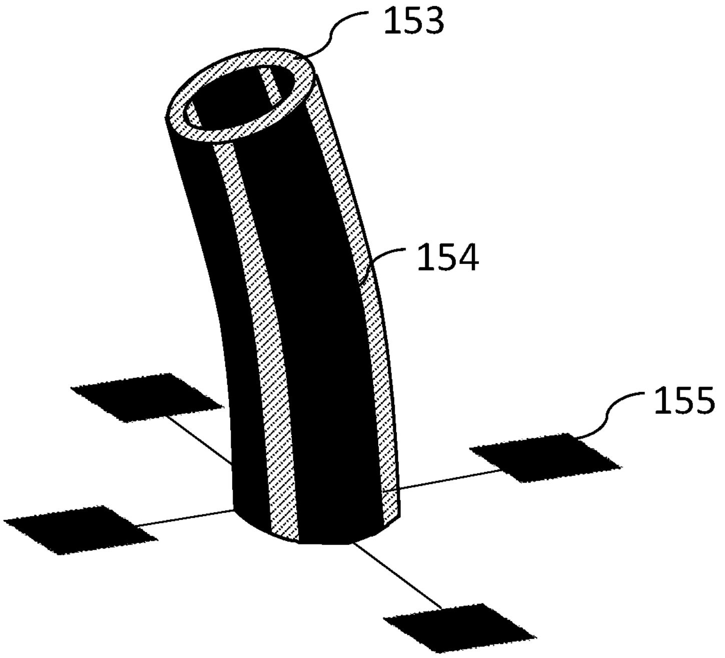
FIG. 15 a schematic representation of a miniaturized piezo tube.

A further application option is the slit piezotube 154 shown in FIG. 15. A dimorph, i.e. electrodes 155 on both sides of the tube 154 have to be electrically separated from one another, is used here. A mirror 153 is attached to the tube 154. The alignment of the mirror 153 can be controlled by means of the distortion of the piezotubes 154. This can be used, for example, for LIDAR (light detection and ranging).

Figure 16:
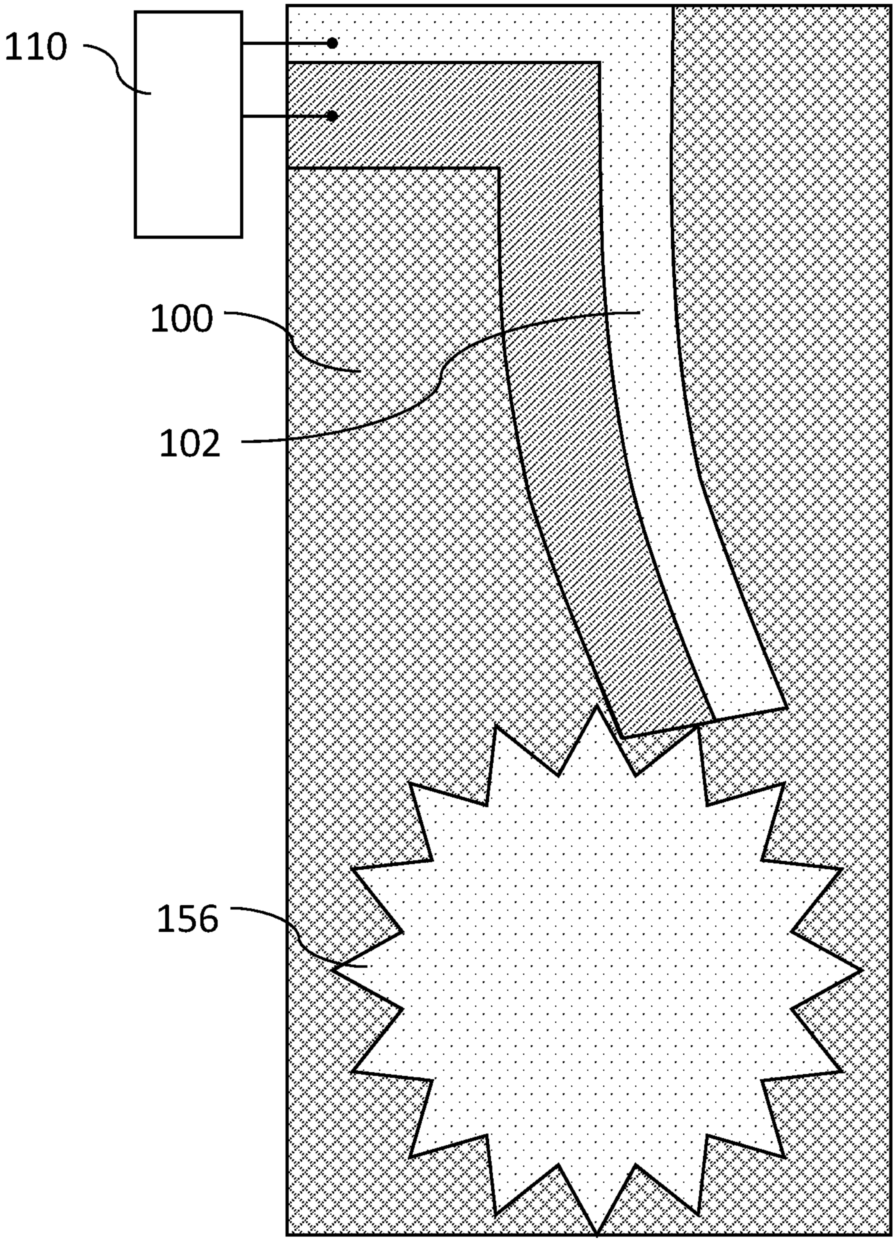
FIG. 16 a schematic plan view of a micromechanical step motor.

A micromechanical latching mechanism shown schematically in FIG. 16 can also be produced with which, for example, the rotational state of a micromechanical cog 156 can be controlled.

It is furthermore possible to implement a linear micromechanical step motor having an oppositely disposed row of cantilevers with a coordinated movement. A microcavity that can be micromechanically coordinated or a Fabry-Pé-rot interferometer can finally also be produced. A membrane is used here. The incident light is filtered in dependence on the wavelength of the light. The distance between the cantilever and the reference window is here typically in the order of magnitude of the wavelength of the light used. The position of the membrane is modulated by means of an external voltage.

Only features of the different embodiments disclosed in the embodiments can be combined with one another and claimed individually.

What is claimed is:

1. A movable piezo element, comprising:

a structured substrate in which an intermediate layer is arranged between a first substrate layer and a second substrate layer;

a first electrode layer of an electrically conductive, non-ferroelectric material arranged on the second substrate layer;

a ferroelectric, piezoelectric, and/or flexoelectric layer arranged on the first electrode layer; and a second electrode layer of an electrically conductive, non-ferroelectric material arranged on the ferroelectric, piezoelectric, and/or flexoelectric layer, wherein the second substrate layer is structured such that at least one bar of the second substrate layer mounted on one side is formed that is spatially spaced apart from the first substrate layer; and a surface of the bar remote from the first substrate layer and a side surface of the bar are is/are at least partially covered by a layer stack of the first electrode layer, the ferroelectric, piezoelectric and/or flexoelectric layer and the second electrode layer.

2. The movable piezo element in accordance with claim 1, wherein the first electrode layer, the ferroelectric, piezoelectric, and/or flexoelectric layer and/or the second electrode layer have a thickness variation at the side surface of below 10% or of a maximum of 5 nm.

3. The movable piezo element in accordance with claim 1, wherein the bar is connected with material continuity along its longitudinal axis at at least one end to the further second substrate layer.

4. The movable piezo element in accordance with claim 1, wherein the bar is meandering or spiral.

5. The movable piezo element in accordance with claim 1, wherein the ferroelectric, piezoelectric, and/or flexoelectric layer has undoped or doped hafnium oxide, undoped or doped zirconium oxide, or an alloy therefrom, with the doped hafnium oxide or the doped zirconium oxide is doped with silicon, aluminum, germanium, gallium, iron, cobalt, chromium, magnesium, calcium, strontium, barium, titanium, zirconium, yttrium, nitrogen, carbon, lanthanum, gadolinium, and/or an element of the rare earths.

6. The movable piezo element in accordance with claim 1, wherein the movable piezo element is used as a MEMS switch, as a MEMS filter, as a MEMS phase shifter, as a cantilever for atomic force microscopy, as a microfluid switch, as a microfluid valve, as a micromirror, as a micropositioner, as an ultrasound transducer, as an ultrasound sensor, as a loudspeaker, as a microphone, as a seismograph, as a microspectrometer, as a micromechanical latching mechanism, as a micromechanical step motor, as a Fabry-Pérot interferometer, or as a flagelliform drive for a micromechanical application.

7. A component having the movable piezo element in accordance with claim 1 and having a transistor or a circuit, wherein the movable piezo element and the transistor or the circuit are electrically contacted by an electric contact having a distance of less than 50 μm.

8. The component in accordance with claim 7, wherein the movable piezo element and the transistor or the circuit are formed as an integrated circuit on a single substrate.

9. The component in accordance with claim 7, wherein the movable piezo element and the transistor or the circuit are formed in a single wiring plane of a CMOS process.

* * * * *